US012626438B2

(12) United States Patent
Kamilov et al.

(10) Patent No.: US 12,626,438 B2
(45) Date of Patent: May 12, 2026

(54) SELF-SUPERVISED JOINT IMAGE RECONSTRUCTION AND COIL SENSITIVITY CALIBRATION IN PARALLEL MRI WITHOUT GROUND TRUTH

(71) Applicant: Washington University, St. Louis, MO (US)

(72) Inventors: Ulugbek Kamilov, St. Louis, MO (US); Hongyu An, St. Louis, MO (US); Yuyang Hu, St. Louis, MO (US); Jiaming Liu, St. Louis, MO (US); Cihat Eldeniz, St. Louis, MO (US); Weijie Gan, St. Louis, MO (US); Yasheng Chen, St. Louis, MO (US)

(73) Assignee: Washington University, St. Louis, MO (US)

( * ) Notice: Subject to any disclaimer, the term of this patent is extended or adjusted under 35 U.S.C. 154(b) by 592 days.

(21) Appl. No.: 17/968,541

(22) Filed: Oct. 18, 2022

(65) Prior Publication Data

US 2023/0122658 A1     Apr. 20, 2023

Related U.S. Application Data

(60) Provisional application No. 63/256,962, filed on Oct. 18, 2021.

(51) Int. Cl.
*G06T 11/00*          (2006.01)
*G01R 33/48*         (2006.01)
(52) U.S. Cl.
CPC ........ *G06T 11/006* (2013.01); *G01R 33/4818* (2013.01)

(58) Field of Classification Search
CPC .............. G06T 11/006; G01R 33/4818; G01R 33/5608; G01R 33/5611
See application file for complete search history.

(56) References Cited

U.S. PATENT DOCUMENTS

| | | | |
|---|---|---|---|
| 11,125,845 B2 | 9/2021 | Sharma | |
| 11,131,735 B2 | 9/2021 | Fernandez Villena et al. | |
| 2005/0058368 A1* | 3/2005 | Moriguchi | G01R 33/285 |
| | | | 324/309 |

(Continued)

OTHER PUBLICATIONS

Jun et al., "Joint Deep Model-based MR Image and Coil Sensitivity Reconstruction Network (Joint-ICNet) for Fast MRI, " 2021 IEEE/CVF Conference on Computer Vision and Pattern Recognition (CVPR), Nashville, TN, USA, 2021, pp. 5266-5275. (Year: 2021).*

(Continued)

*Primary Examiner* — Vu Le
*Assistant Examiner* — Rachel Anne Ometz

(57)          ABSTRACT

Systems and methods for image reconstruction for parallel MR imaging are disclosed that receive a k-space single-coil measurement dataset that includes at least two k-space single-coil measurement sets, transforming the k-space single-coil measurement dataset to an estimated CSM using a coil sensitivity estimation module, and transforming the k-space single-coil measurement dataset and the estimated CSM into a final MR image using an MRI reconstruction module. In some aspects, the coil sensitivity estimation module and MRI reconstruction module include deep learning neural networks trained without the use of ground truth data.

14 Claims, 9 Drawing Sheets

(56) References Cited

U.S. PATENT DOCUMENTS

| | | | | |
|---|---|---|---|---|
| 2020/0241096 A1* | 7/2020 | Bustin | ................ | G01R 33/4818 |
| 2020/0249300 A1* | 8/2020 | Sandino | ................ | G01R 33/58 |
| 2020/0249302 A1* | 8/2020 | Van Den Brink | ... | G01R 33/583 |
| 2020/0355774 A1* | 11/2020 | Wang | ................ | G01R 33/0029 |
| 2022/0051454 A1* | 2/2022 | Nickel | ............... | G01R 33/5611 |
| 2022/0252683 A1* | 8/2022 | Mostapha | ........... | G01R 33/246 |

OTHER PUBLICATIONS

Bian et al., An Optimal Control Framework for Joint-channel Parallel MRI Reconstruction without Coil Sensitivities, Magn Reson Imaging, Jun. 2022, vol. 89, pp. 1-11.

Hammernik et al., Systematic evaluation of iterative deep neural networks for fast parallel MRI reconstruction with sensitivity-weighted coil combination, Magnetic Resonance in Medicine, Apr. 2021, vol. 86, pp. 1859-1872.

Islam et al., Compressed sensing regularized calibrationless parallel magnetic resonance imaging via deep learning, Biomedical Signal Processing and Control, Apr. 2021, vol. 66.

Jun et al., Joint Deep Model-based MR Image and Coil Sensitivity Reconstruction Network (Joint-ICNet) for Fast MRI, IEEE/CVF Conference on Computer Vision and Pattern Recognition (CVPR), 2021, pp. 5266-5275.

Liu et al., Rare: Image Reconstruction using Deep Priors Learned without Groundtruth, IEEE Journal of Selected Topics in Signal Processing, 2019, pp. 1088-1099.

Hammernik et al., $\Sigma$-net: Systematic evaluation of iterative deep neural networks for fast parallel MRI reconstruction with sensitivity-weighted coil combination, Dec. 2019, ArXiv.

* cited by examiner

SELF-SUPERVISED JOINT IMAGE RECONSTRUCTION AND COIL SENSITIVITY CALIBRATION IN PARALLEL MRI WITHOUT GROUND TRUTH

CROSS-REFERENCE TO RELATED APPLICATIONS

This application claims priority from U.S. Provisional Application Ser. No. 63/256,962 filed on Oct. 18, 2021, which is incorporated herein by reference in its entirety.

STATEMENT REGARDING FEDERALLY SPONSORED RESEARCH OR DEVELOPMENT

Not applicable.

MATERIAL INCORPORATED-BY-REFERENCE

Not applicable.

FIELD OF THE INVENTION

The present disclosure generally relates to systems and methods of performing parallel MR imaging (PMRI).

BACKGROUND OF THE INVENTION

Magnetic resonance imaging (MRI) is one of the leading diagnostic modalities in radiology. It is well-known that data acquisition in MRI is relatively slow compared to other popular diagnostic modalities such as computed tomography (CT). As a consequence, there has been broad interest in techniques for improving the speed of MRI data acquisition. Parallel MRI (PMRI) is one of the most widely used acceleration strategies that relies on the spatial encoding provided by multiple receiver coils to reduce the amount of data that is acquired. In order to combine the data collected by multiple coils, PMRI requires the calibration of coil sensitivities. Calibration can be performed either in k-space or in the image space using coil sensitivity maps (CSMs). Compressed sensing (CS) MRI is a complementary technique that is used for further accelerating data collection by exploiting prior knowledge (sparsity, low-rankness) on the unknown image.

Over the past few years, deep learning (DL) has gained popularity for image reconstruction in CS-MRI due to its excellent performance. Recent work has shown the potential of jointly estimating high-quality images and CSMs in an end-to-end manner. However, these methods require fully sampled ground-truth data for the supervised training of the corresponding deep neural networks, making their application challenging when ground truth is unavailable. On the other hand, there has also been broad interest in developing self-supervised DL methods that rely exclusively on the information available in the undersampled measurements. The self-supervised DL in the context of joint image reconstruction and coil sensitivity estimation may be a potential advancement in CS-MRI.

SUMMARY OF THE INVENTION

Among the various aspects of the present disclosure is the provision of systems and methods for reconstructing parallel MR images from at least two single-coil k-space measurement sets without any need for CSM calibration using deep learning models trained without any need for ground truth data.

In one aspect, a computer-aided method of image reconstruction for parallel MR imaging is disclosed that includes receiving a k-space single-coil measurement dataset comprising at least two k-space measurement sets, each k-space measurement set obtained by a single coil of a parallel MR imaging device; transforming, using the computing device, the k-space single-coil measurement dataset to an estimated CSM using a coil sensitivity estimation module; and transforming, using the computing device, the k-space single-coil measurement dataset and the estimated CSM into a final MR image using an MRI reconstruction module. In some aspects, the coil sensitivity estimation module comprises a CSM deep neural network. In some aspects, the deep neural network comprises a CSM convolutional neural network. In some aspects, transforming the k-space single-coil measurement dataset to an estimated CSM further comprises: extracting a small central k-space region from each k-space measurement set; transforming each small central k-space region into a single-coil MR image comprising a plurality of complex elements, and transforming the single-coil MR images into the estimated CSM using the CSM deep neural network. In some aspects, extracting the small central k-space regions comprises applying a Hamming window to each k-space measurement set. In some aspects, transforming each small central k-space region into a corresponding single-coil MR image comprises applying a zero-filled inverse Fourier transform to each small central k-space region. In some aspects, transforming the k-space single-coil measurement dataset to an estimated CSM further comprises: separating a real value and an imaginary value from each complex element of each single-coil MR image and concatenating the real and imaginary values of all single-coil MR images into a single-coil MR image dataset, and transforming the single-coil MR image dataset into the estimated CSM using the CSM deep neural network. In some aspects, the method further comprises transforming the single-coil MR image dataset into the estimated CSM using the CSM deep neural network further comprises calculating the estimated CSM $\hat{S}$ according to the equation: $\hat{S}=P_\varphi(p^0)$ wherein $P_\varphi$ represents the CSM with predetermined parameters $\varphi$ and $p^0$ represents the zero-filled inverse Fourier transform of the small central k-space regions from each k-space measurement set. In some aspects, the MRI reconstruction module comprises an unfolded regularization by denoising (U-RED) module, the U-RED module comprising a data consistency module and a regularization module, the regularization module comprising a U-RED deep neural network (DNN). In some aspects, transforming the k-space single-coil measurement dataset and the estimated CSM into an MR image further comprises transforming each k-space measurement set into an intermediate single-coil MR image using a Fourier transform; performing unfolded regularization by denoising comprising K iterations, each iteration comprising refining the intermediate single-coil MR images using the regularization module and enforcing consistency of intermediate single-coil k-space data predicted from the intermediate single-coil MR images with the k-space single-coil measurement dataset; and transforming the intermediate single-coil images as refined after U-RED into the final MR image. In some aspects, refining the intermediate single-coil MR images using the regularization module further comprises: transforming the intermediate single-coil MR images into an intermediate MR image using the estimated CSM, and transforming the intermediate MR image into a regularization correction using the U-RED DNN. In some aspects, enforcing consistency of the intermediate single-coil k-space data further comprises transforming the intermediate single-coil MR images into intermediate single-coil k-space data using a Fourier transform; transforming the intermediate single-coil k-space data into the predicted intermediate single-coil k-space measurements using an undersampling operator, and calculating the difference between the predicted intermediate single-coil k-space measurements and the k-space single-coil measurement dataset to produce a data consistency correction. In some aspects, each iteration of performing unfolded regularization by denoising further comprises updating the intermediate single-coil MR images based on the regularization correction and the data consistency correction. In some aspects, updating the intermediate single-coil MR images based on the regularization correction and the data consistency correction comprises calculating the updated intermediate single-coil MR images $\hat{c}^{k+1}$ according to the equation:

$$\hat{c}^{k+1} = \hat{c}^k - \gamma^k \left( \nabla g(\hat{c}^k, y) + \tau^k \hat{S} R_\theta^k (\hat{S}^\dagger \hat{c}^k) \right),$$

with $\nabla g(\hat{c}^k, y) = F^\dagger (\hat{P} F \hat{c}^k - y)$ wherein $\hat{c}^k$ represents the intermediate multi-coil images in the kth iteration of K iterations, $$\gamma^k \left( \nabla g(\hat{c}^k, y) \right)$$

represents the data consistency correction, $$\tau^k \hat{S} R_\theta^k (\hat{S}^\dagger \hat{c}^k))$$

represents the regularization correction, $\gamma^k$ represents pre-determined consistency parameters, $\tau^k$ represents pre-determined regularization parameters, $\hat{S}$ represents the estimated CSM, $R_\theta^k$ represents the U-RED DNN with pre-determined parameters $\theta$, $\hat{S}^\dagger$ represents the inverse of the estimated CSM, $F^\dagger$ represents the inverse Fourier transform, $\hat{P}$ represents the k-space sampling operator, and y represents the k-space single-coil measurement dataset. In some aspects, the method further includes training the CSM DNN and the U-RED DNN using a stochastic gradient method to jointly optimize parameters φ of the CSM DNN $P_\varphi$ and parameters θ of the U-RED DNN $R_\theta$ using a training set comprising N multi-coil undersampled k-space measurement pairs $$\{\hat{y}_i, \tilde{y}_i\}_1^N, \hat{y}_i$$

denoting training measurements, $\tilde{y}_i$ comprising raw measurements, wherein the measurements in each pair are acquired from the same object. In some aspects, the multi-coil undersampled measurement pairs $$\{\hat{y}_i, \tilde{y}_i\}_1^N$$

are acquired from at least one of: at least two measurement sets of the same object obtained in at least two different parallel MR scans and two subsets of a measurement set obtained in a single parallel MR scan. In some aspects, the training set does not comprise a ground truth dataset. In some aspects, training the CSM DNN and the U-RED DNN using a stochastic gradient method further comprises minimizing a weighted sum loss function given by $$Loss = Loss_{rec} + \lambda \cdot Loss_{smooth},$$

$$\text{wherein } Loss_{rec} = \frac{1}{N} \sum_i^N \mathcal{L}_{rec}(\hat{H}^i \hat{x}^i, \hat{y}^i) + \mathcal{L}_{rec}(\hat{H}^i \hat{x}^i, \tilde{y}^i)$$

$$\text{and } Loss_{smooth} = \frac{1}{N} \sum_i^N \left\| D\hat{S}^i \right\|_2^2 + \left\| D\tilde{S}^i \right\|_2^2;$$

where $\lambda$ is a regularization parameter, $\mathcal{L}_{rec}$ denotes the $\ell_2$-norm, and D denotes the discrete gradient.

In another aspect, a system for image reconstruction for parallel MR imaging, the system comprising a computing device comprising at least one processor, the at least one processor configured to receive a k-space single-coil measurement dataset comprising at least two k-space measurement sets, each k-space measurement set obtained by a single coil of a parallel MR imaging device; transform the k-space single-coil measurement dataset to an estimated CSM using a coil sensitivity estimation module, and transform the k-space single-coil measurement dataset and the estimated CSM into a final MR image using an MRI reconstruction module. In some aspects, the coil sensitivity estimation module comprises a CSM deep neural network.

Other objects and features will be in part apparent and in part pointed out hereinafter.

DESCRIPTION OF THE DRAWINGS

Those of skill in the art will understand that the drawings, described below, are for illustrative purposes only. The drawings are not intended to limit the scope of the present teachings in any way.

DETAILED DESCRIPTION OF THE INVENTION

Figure 1:
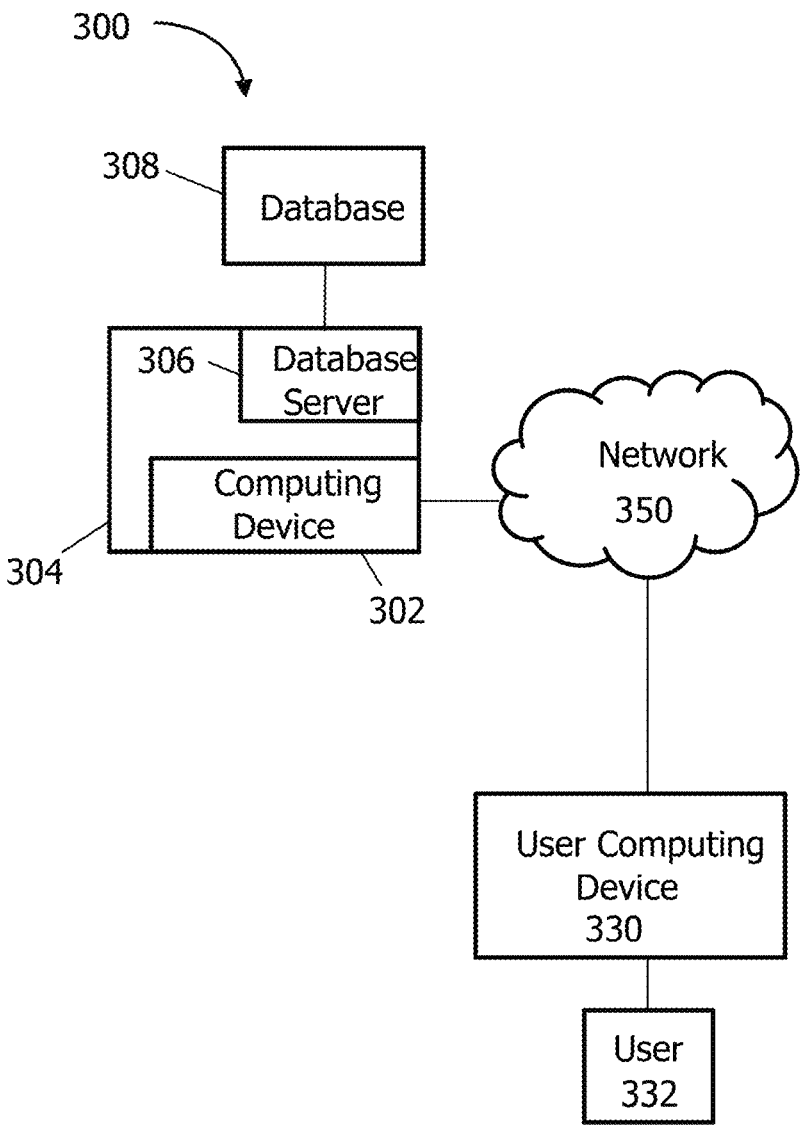
FIG. 1 is a block diagram schematically illustrating a system in accordance with one aspect of the disclosure.

In various aspects, a self-supervised image reconstruction method, SS-JIRCS, for parallel MRI that is equipped with automatic CSM calibration is described.

In various aspects, a model-based deep learning method for jointly reconstructing images and calibrating coil sensitivity maps (CSMs) for parallel MRI is disclosed. The disclosed method is performed using a computational framework that includes a reconstruction module and a coil sensitivity estimator that estimates CSMs directly from the raw measurements. The reconstruction module is based on the unfolded regularization by denoising (U-RED) method, which enforces data consistency and imposes smoothness. The disclosed method makes use of deep learning networks that are trained in a self-supervised manner using under-sampled and uncalibrated measurements without any need for fully sampled ground-truth data. As described in the examples below, empirical results show that the joint image reconstruction and CSM calibration based on parallel MR data using the disclosed method enhances image quality as compared to existing methods that use pre-calibrated CSMs.

As described herein, a model-based DL architecture based on the unfolded regularization by denoising (RED) algorithm equipped with a dedicated CSM calibration module is developed to perform the disclosed self-supervised image reconstruction method. The full DL network consists of three complementary modules for (a) data consistency, (b) regularization, and (c) CSM calibration. In addition, a self-supervised training strategy inspired by Artifact2Artifact (A2A) is developed that makes use of training data consisting of a set of undersampled and noisy k-space measurements, without any fully sampled ground truth. The self-supervised image reconstruction method is evaluated and compared to existing methods using simulated MRI data.

Inverse Problem Formulation

The measurement model in PMRI can be formulated as a linear system as expressed in Eqn. (1):

$$y = Hx + e, H - PFS \qquad (1)$$

where $x \in \mathbb{C}^n$ is the unknown image, $y \in \mathbb{C}^{mc}$ is the corresponding multi-coil measurement, $F \in \mathbb{C}^{nc \times nc}$ is the Fourier transform operator, $P \in \mathbb{C}^{mc \times nc}$ is the k-space sampling operator, and $e \in \mathbb{C}^{mc}$ is a noise vector. The matrix $S \in \mathbb{C}^{nc \times n}$ represents the unknown sensitivity profiles of the receiver coils, where the constant c denotes the total number of coils. Note that S varies for each scan, since it depends on the interaction of the coils with the anatomy being imaged.

When the matrix S is known, image reconstruction can be formulated as a regularized optimization as expressed by Eqn. (2):

$$\underset{x \in \mathbb{C}^n}{\arg\min}\, g(x) + h(x) \qquad (2)$$

where g is the data fidelity term that quantifies consistency with the observed data y and h is a regularizer that encodes prior knowledge on x. For example, widely used functions in PMRI for g and h are, respectively, the least-squares and the total variation functions, as given by Eqn. (3):

$$g(x) = \frac{1}{2}\|Hx - y\|_2^2 \text{ and } h(x) = \frac{1}{2}\tau\|Dx\|_1 \qquad (3)$$

where $\tau > 0$ controls the regularization strength and D is the discrete gradient.

Deep learning (DL) has gained popularity over the past few years in MRI reconstruction due to its excellent performance. Traditional DL seeks to train a deep neural network (DNN), such as U-net, to learn a regularized inversion of H by mapping the corrupted images $$\{H_i^\dagger y_i\}_{i=1}^N$$

or the raw measurements $$\{y_i\}_{i=1}^N$$

to their desired fully sampled ground-truth $$\{x_i\}_{i=1}^N.$$

Here, N>0 refers to the number of training samples, and $H^\dagger$ is an approximate in-version of H like the zero-filled inverse Fourier transform.

Model-based DL methods seek to integrate DL with model-based optimization. Plug-and-play priors (PnP) and regularization by denoisers (RED) are examples of a family of methods that leverages pre-trained deep denoisers as imaging priors. Deep unfolding is a related class of methods that interpret the iterations of regularized optimization as layers of a deep neural network and trains the resulting architecture in an end-to-end fashion. Different deep unfolding architectures can be obtained by using various optimization/reconstruction algorithms. In various aspects, the disclosed image reconstruction method includes an unfolded variant of the gradient-based RED algorithm.

Reconstruction Using Pre-Calibrated CSMs

Existing reconstruction methods typically include two widely-used image formation approaches in PMRI: (a) those that formulate reconstruction as a k-space interpolation problem, and (b) those that seek to explicitly characterize S as a set of CSMs. In the second approach, S is first pre-calibrated and then used to solve the inverse problem of Eqn. (1). In various aspects, the disclosed image reconstruction method adopts this second approach.

Pre-calibrated CSMs can either be obtained by performing a separate calibration scan or CSMs may be estimated directly from the central k-space regions of a fully sampled scan. The latter approach is adopted in the widely-used ESPIRiT method. There are a number of issues and challenges with the pre-calibration approaches. One issue is that the inconsistencies between the calibration scan and the accelerated scan can result in imaging artifacts. Another issue is that the estimated CSMs may not be sufficiently accurate for high levels of k-space subsampling. Additionally, a calibration scan extends the total scan time.

Joint Reconstruction and CSM Calibration

Existing optimization-based methods for joint image reconstruction and CSM calibration treat S as another unknown variable in Eqn. (2) and alternate between updating the image and updating the coil sensitivities. Deep unfolding has recently been proposed to perform joint estimation of images and CSMs obtained without any pre-calibration procedures. The concept behind these methods is to model CSM calibration as a trainable DNN module that can be optimized simultaneously with other learnable parameters in the deep network. The inputs to the CSM calibration modules may include the original undersampled measurements or the intermediate results available at different layers of the deep unfolded networks.

In various aspects, this self-supervised approach for joint reconstruction and CSM calibration that requires no fully-sampled ground truth forms the basis of the reconstruction methods disclosed herein.

Self-Supervised Image Reconstruction

Figure 5:
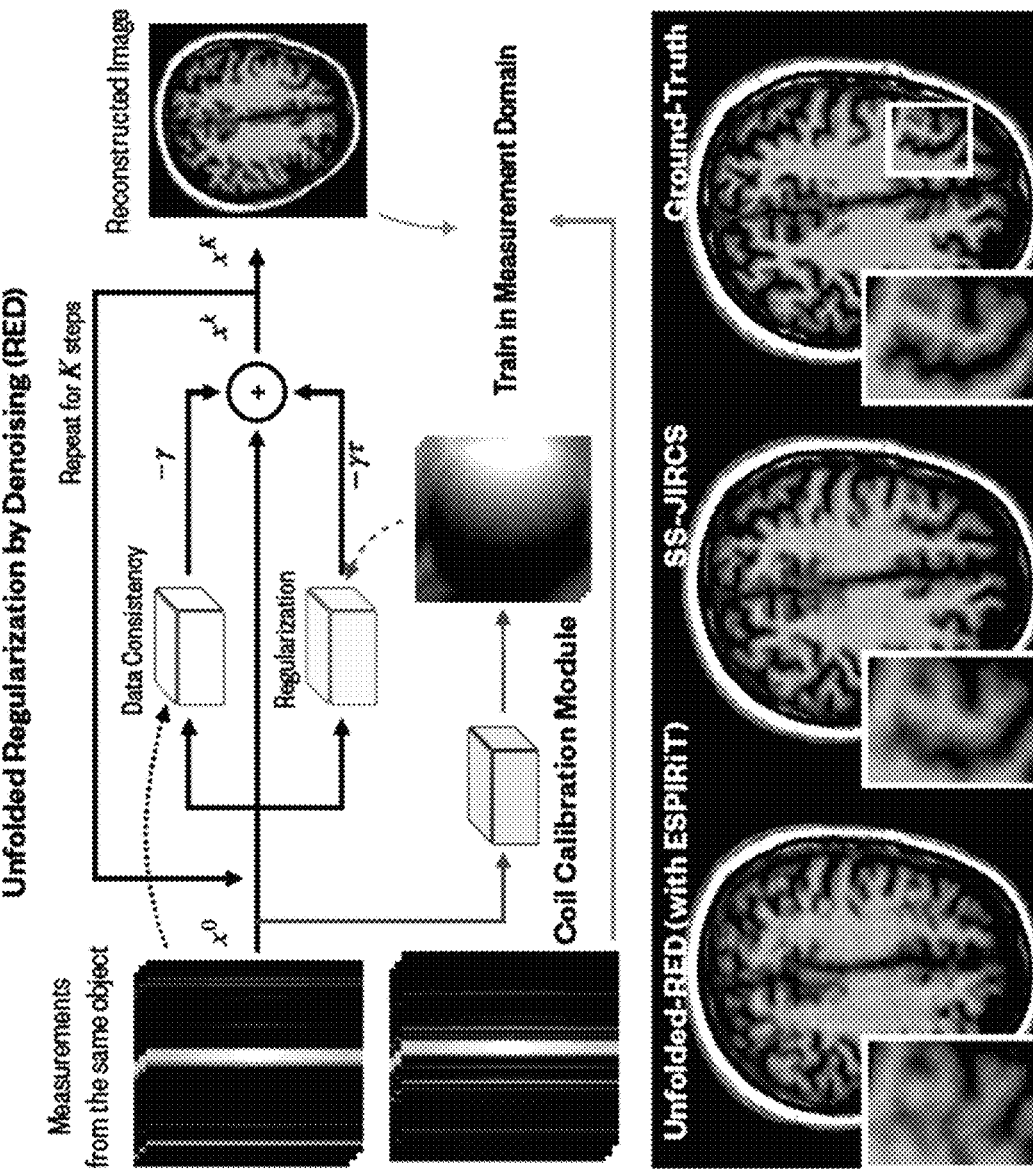
FIG. 5 is a schematic diagram depicting a self-supervised learning framework, SS-JIRCS, that forms images from uncalibrated multi-coil MR measurements by leveraging a coil sensitivity calibration module, resulting in enhanced image quality compared to an existing reconstruction method that relies on pre-estimated coil sensitivity maps (CSMs).

In various aspects, DL-based image reconstruction methods are used to reduce the dependence of training on high-quality ground-truth data. The reconstruction methods disclosed herein are inspired by a widely adopted framework shown illustrated in FIG. 5, Noise2Noise (N2N). In the N2N method, a DNN $R_\theta$ is trained on a set of noisy images $\{\hat{x}_{i,j}\}$ with j indexing different realizations of the same underlying image i. Artifact2Artifact (A2A), a reconstruction method based on N2N, has shown excellent reconstruction performance using multiple noisy and artifact-corrupted images $\{\hat{x}_{i,j}\}$ obtained directly from sparsely sampled MR measurements. In A2A, ij denotes the jth MRI acquisition of Subject i such that each acquisition consists of an independent undersampling pattern and noise realization. The DNN $R_\theta$ can be trained by minimizing a loss function as expressed by Eqn. (4):

$$\arg\min_{\theta} \sum_{i,j,j'} \mathcal{L}\left(\hat{x}_{i,j'}, R_\theta(\hat{x}_{i,j})\right) \qquad (4)$$

where popular choices of $\mathcal{L}$ include the $\ell$ 1 norm and the $\ell$ 2 norm.

While the concept of N2N enables the training of the DNN for PMRI without any fully sampled data, N2N reconstruction relies on pre-calibrated CSMs. In various aspects, the reconstruction methods disclosed herein do not require pre-scan calibration, but instead, use the N2N/A2A framework for joint reconstruction and CSM calibration without a ground truth as described below.

Joint Reconstruction and CSM Method

Figure 6:
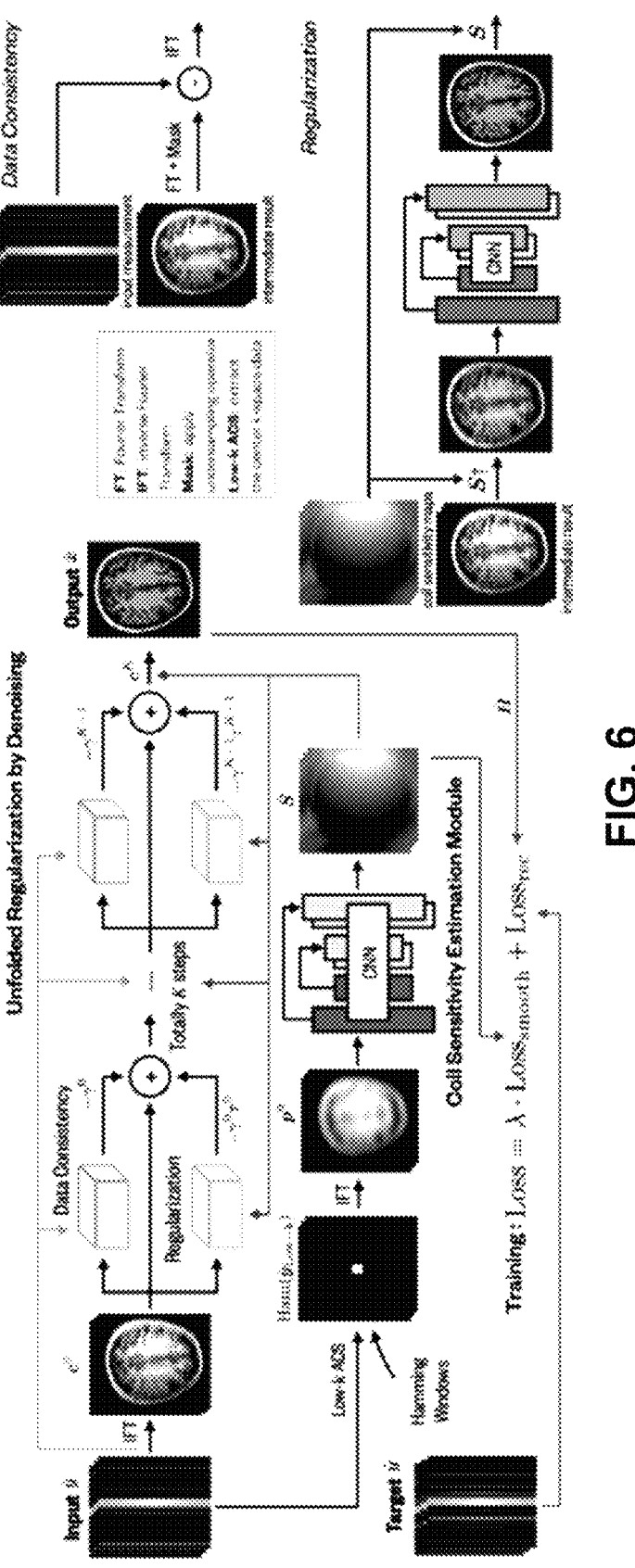
FIG. 6 is a flow chart illustrating the disclosed joint image reconstruction and CSM calibration method that includes an unfolded regularization by denoising (U-RED) reconstruction module and a coil sensitivity calibration module that maps multi-coil undersampled measurements to a single high-quality image and coil sensitivity maps, respectively. The network is trained directly on raw k-space measurements where the input and the target measurement correspond to the same object.

In various aspects, the disclosed joint reconstruction and CSM method receives multi-coil undersampled measurements as inputs and produces reconstructed images and CSMs as the output. As illustrated in FIG. 6, the disclosed framework consists of two modules: (a) a coil sensitivity (CSM) estimation module that uses information extracted from the raw measurements, and (b) an unfolded MRI reconstruction module (unfolded regularization by denoising) that forms reconstructed images from the input measurements and the estimated CSMs. The training procedure uses a set of multi-coil undersampled measurement pairs $$\{\hat{y}_i, \tilde{y}_i\}_1^N$$

where the measurements in the same pair are acquired from the same object. $\hat{y}_i$ and $\tilde{y}_i$ are given by Eqn. (5):

$$\hat{y}_i = \hat{H}_i x_i + \hat{e}_i \text{ and } \tilde{y}_i = \tilde{H}_i x_i + \tilde{e}_i \qquad (5)$$

The number $N \geq 1$ denotes the total number of training samples. In various aspects, the measurements $\hat{y}_i$ and $\tilde{y}_i$ can correspond to two subsets extracted from a single acquisition or two separate MRI acquisitions. Note that our training procedure does not require any ground-truth images or known CSMs.

Coil Sensitivity Estimation Module

In various aspects, the coil sensitivity estimation module transforms input measurements $\hat{y}$ and the corresponding sampling matrix P into a coil sensitivity map (CSM). The coil sensitivity estimation module forms CSMs from the uncalibrated multi-coil measurements by performing three steps: (a) a small central region of k-space is extracted by applying the Hamming window: $\text{Ham}(\hat{y}_{Low-k})$, where $\hat{y}_{Low-k}$ denotes the central region without the Hamming window; (b) $\text{Ham}(\hat{y}_{Low-k})$ is mapped back to the image domain by applying the zero-filled inverse Fourier transform $p^0 = F^\dagger \text{Ham}(\hat{y}_{Low-k})$, and (c) $p^0$ is fed into a DNN $P_\varphi$ with trainable parameters $\varphi \in \mathbb{R}^q$ to obtain estimated CSMs: $\hat{S} = P_\varphi(p^0)$.

In various aspects, $P_\varphi$ is implemented as a convolutional neural network that operates on real-valued multichannel data. Since $p^0$ is complex-valued, $p^0$ is reshaped by splitting its real and imaginary parts and concatenating the resulting two multi-coil datasets into an image with the number of channels being 2c. The output of $P_\varphi$ is reformatted into a complex-valued matrix $\hat{S}$ with the same dimensions as the original $p^0$.

Unfolded Regularization by Denoising

In various aspects, the image reconstruction module used in the methods disclosed herein is based on the unfolded RED (U-RED) architecture and iteratively refines the image by integrating information from DNN $R_\theta$ with learnable parameters $\theta \in \mathbb{R}^P$ and imposing consistency between the predicted and the raw measurements via $\nabla g$. In some aspects, $\hat{c}^0 = F^\dagger \hat{y}$ is used to represent the initial image, and $K \geq 1$ represents the total number of steps. In various aspects, the U-RED architecture is formulated as Eqn. (6):

$$\hat{c}^{k+1} = \hat{c}^k - \gamma^k \left( \nabla g(\hat{c}^k, y) + \tau^k \hat{S} R_\theta^k(\hat{S}^\dagger \hat{c}^k) \right) \tag{6}$$

where $\gamma^k$ and $\tau^k$ are learnable parameters, $\hat{c}^k$ represents the intermediate multi-coil images in the kth step, $(\nabla g(\hat{c}^k, y)$ is a data consistency term, and $$\hat{S} R_\theta^k(\hat{S}^\dagger \hat{c}^k)$$

is a regularization term.

$(\nabla g(\hat{c}^k, y)$ may also be expressed as Eqn. (7):

$$(\nabla g(\hat{c}^k, y) = F^\dagger(\hat{P} F \hat{c}^k - y) \tag{7}$$

In various aspects, DNN $$R_\theta^k$$

in Eqn. (6) takes single-coil images as inputs, requiring $\hat{S}^\dagger$ and $\hat{S}$ that fuse multiple images into a single image and expands a single image into multiple images, respectively. The final reconstructed image $\hat{x}$ can be obtained from the output of the last step: $\hat{x} = \hat{S}^\dagger \hat{c}^K$. Note that, unlike the existing unfolded methods that consider pre-calibrated g, the methods disclosed herein train a network to calibrate g simultaneously with reconstruction.

Training Procedure

In various aspects, a standard stochastic gradient method is used to jointly optimize $$\{\theta_k\}_k^K$$

by minimizing a weighted sum loss function given by

Eqn. (8)

$$\text{Loss} = \text{Loss}_{rec} + \lambda \cdot \text{Loss}_{smooth} \tag{8}$$

where $\lambda$ is a regularization parameter.

$\text{Loss}_{rec}$ seeks to map each $\hat{y}^i$ and the corresponding $\tilde{y}^i$ to each other. The reconstructed images are mapped back to the k-space domain by applying the forward operator of the training target. By way of non-limiting example, $\hat{x}^i$ may be mapped back to the k-space domain by applying the forward operator $\tilde{H}^i$ and then penalize the discrepancy between the resulting measurements $\tilde{H}^i \hat{x}^i$ and raw measurements $\tilde{y}^i$. Here, the CSMs $\tilde{S}^i$ in $\tilde{H}^i$ are estimated by the coil sensitivity estimation module described herein, after feeding $\tilde{y}^i$ as the input.

In some aspects, the formulation of $\text{Loss}_{rec}$ is given by Eqn. (9):

$$\text{Loss}_{rec} = \frac{1}{N} \sum_i^N \mathcal{L}_{rec}\left(\hat{H}^i \hat{x}^i, \tilde{y}^i\right) + \mathcal{L}_{rec}\left(\hat{H}^i \hat{x}^i, \tilde{y}^i\right) \tag{9}$$

where $\tilde{x}^i$ is the reconstructed image when $\tilde{y}^i$ is the input measurement, and $\mathcal{L}_{rec}$ denotes the $\ell$ 2-norm. Note that N2N/A2A can be seen as a special case of Eqn. (9) that assumes the CSMs are pre-calibrated and not parameterized. During minimization, $\text{Loss}_{rec}$ enforces the accuracy between the predicted and the raw measurements, but may also generate non-smooth CSMs that are not physically realistic and cause overfitting. In some aspects, $\text{Loss}_{smooth}$ is included in Eqn. (8) to impose smoothness on the estimated CSMs, as expressed in Eqn. (10):

$$\text{Loss}_{smooth} = \frac{1}{N} \sum_i^N \left\| D\hat{S}^i \right\|_2^2 + \left\| D\tilde{S}^i \right\|_2^2 \tag{10}$$

Computing Systems and Devices

In various aspects, the disclosed PMRI reconstruction method may be implemented using a computing system or computing device. FIG. 1 depicts a simplified block diagram of the system for implementing the computer-aided methods of monitoring neuroplasticity described herein. As illustrated in FIG. 1, the computing device 300 may be configured to implement at least a portion of the tasks associated with the disclosed methods of monitoring neuroplasticity described herein. The computer system 300 may include a computing device 302. In one aspect, the computing device 302 is part of a server system 304, which also includes a database server 306. The computing device 302 is in communication with a database 308 through the database server 306. The computing device 302 is communicably coupled to a user computing device 330 through a network 350. The network 350 may be any network that allows local area or wide area communication between the devices. For example, the network 350 may allow communicative coupling to the Internet through at least one of many interfaces including, but not limited to, at least one of a network, such as the Internet, a local area network (LAN), a wide area network (WAN), an integrated services digital network (ISDN), a dial-up-connection, a digital subscriber line (DSL), a cellular phone connection, and a cable modem. The user computing device 330 may be any device capable of accessing the Internet including, but not limited to, a desktop computer, a laptop computer, a personal digital assistant (PDA), a cellular phone, a smartphone, a tablet, a phablet, wearable electronics, smartwatch, or other web-based connectable equipment or mobile devices.

Figure 2:
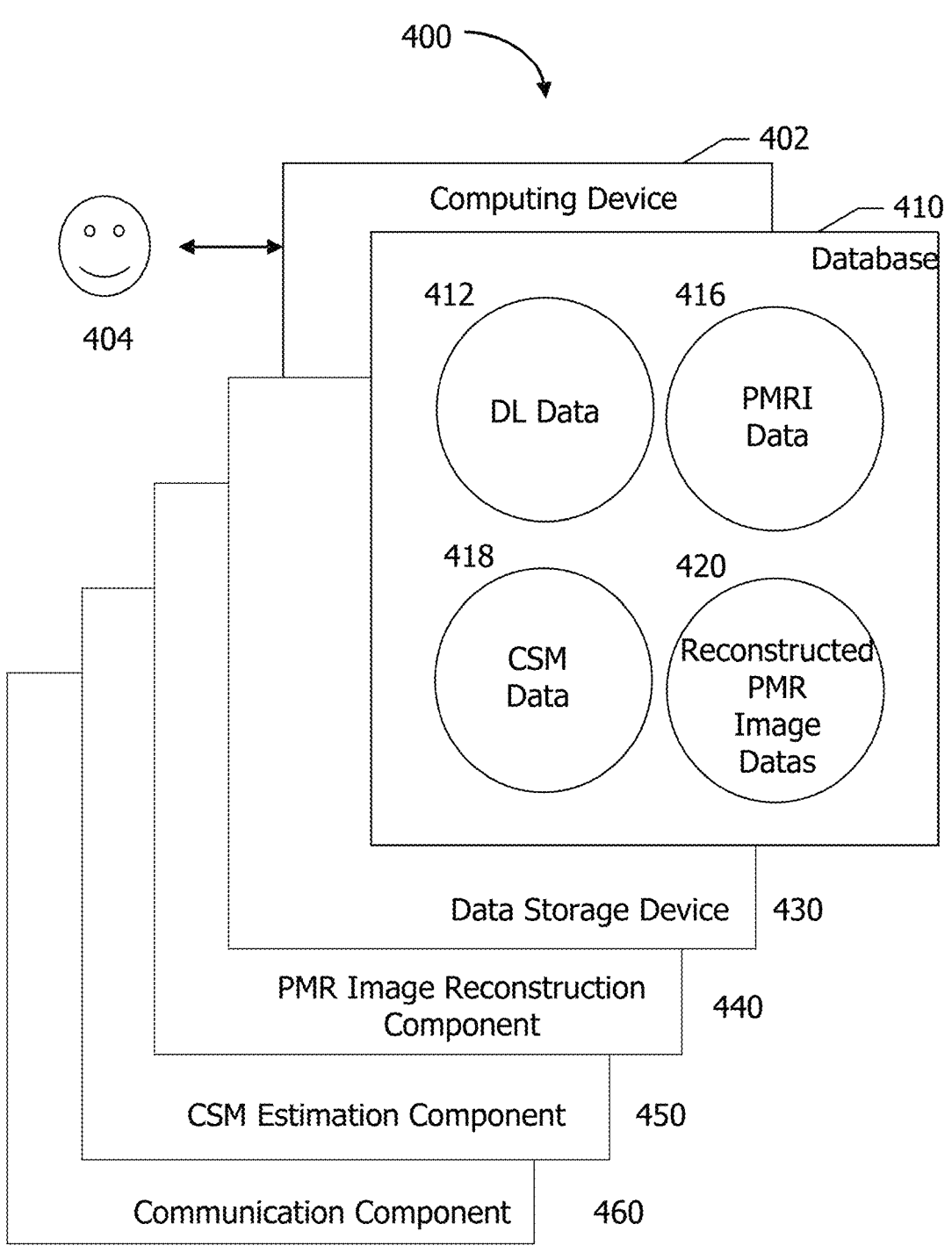
FIG. 2 is a block diagram schematically illustrating a computing device in accordance with one aspect of the disclosure.

In other aspects, the computing device 302 is configured to perform a plurality of tasks associated with the disclosed computer-aided method of parallel MR image reconstruction. FIG. 2 depicts a component configuration 400 of computing device 402, which includes database 410 along with other related computing components. In some aspects, computing device 402 is similar to computing device 302 (shown in FIG. 1). A user 404 may access components of computing device 402. In some aspects, database 410 is similar to database 308 (shown in FIG. 1).

In one aspect, database 410 includes DL data 412, PMRI data 416, CSM data, and reconstructed PMR image data 420. Non-limiting examples of suitable DL data 412 include any values of parameters defining the implementation of the PMR reconstruction method disclosed herein including, but not limited to, parameters defining the deep neural networks of the MRI reconstruction module and the coil sensitivity estimation module, and any other parameters defining any other aspect of implementing the PMR image reconstruction method as described herein. In one aspect, the PMRI data 416 includes measured single-coil k-space measurements, k-space sampling operators, and paired training measurements as described herein.

Computing device 402 also includes a number of components that perform specific tasks. In the exemplary aspect, computing device 402 includes data storage device 430, parallel MR (PMR) image reconstruction component 440, coil sensitivity map estimation component 450, and communication component 460. Data storage device 430 is configured to store data received or generated by computing device 402, such as any of the data stored in database 410 or any outputs of processes implemented by any component of computing device 402.

The PMR image reconstruction component 440 enables the reconstruction of at least two single-coil k-space measurement sets into a PMR image using a deep neural network model such as the U-RED model described herein. The CSM estimation module 450 enables the estimation of the CSM by transforming the at least two single-coil k-space measurement sets into an estimated CSM using a CSM estimation deep neural network.

Communication component 460 is configured to enable communications between computing device 402 and other devices (e.g. user computing device 330 shown in FIG. 1) over a network, such as network 350 (shown in FIG. 1), or a plurality of network connections using predefined network protocols such as TCP/IP (Transmission Control Protocol/Internet Protocol).

Figure 3:
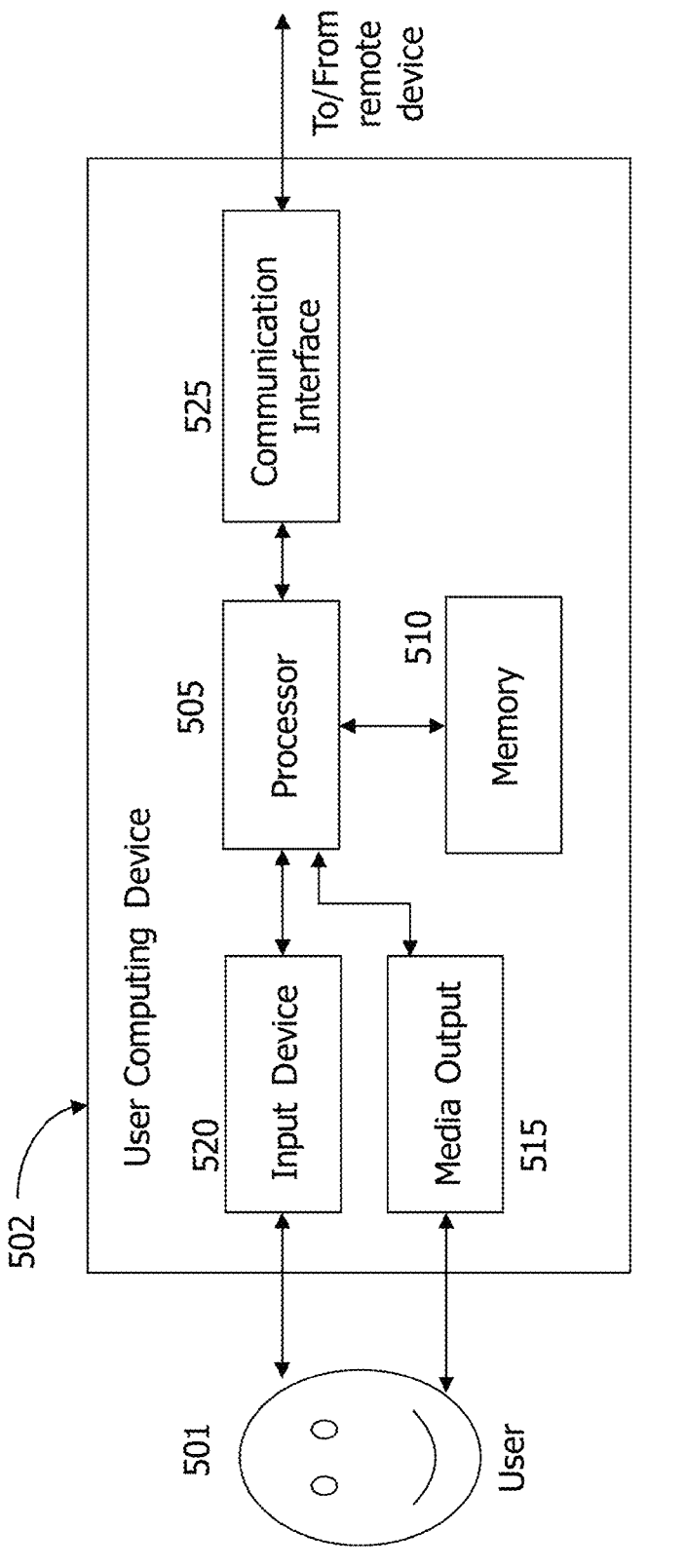
FIG. 3 is a block diagram schematically illustrating a remote or user computing device in accordance with one aspect of the disclosure.

FIG. 3 depicts a configuration of a remote or user computing device 502, such as user computing device 330 (shown in FIG. 1). Computing device 502 may include a processor 505 for executing instructions. In some aspects, executable instructions may be stored in a memory area 510. Processor 505 may include one or more processing units (e.g., in a multi-core configuration). Memory area 510 may be any device allowing information such as executable instructions and/or other data to be stored and retrieved. Memory area 510 may include one or more computer-readable media.

Computing device 502 may also include at least one media output component 515 for presenting information to a user 501. Media output component 515 may be any component capable of conveying information to user 501. In some aspects, media output component 515 may include an output adapter, such as a video adapter and/or an audio adapter. An output adapter may be operatively coupled to processor 505 and operatively coupleable to an output device such as a display device (e.g., a liquid crystal display (LCD), organic light-emitting diode (OLED) display, cathode ray tube (CRT), or "electronic ink" display) or an audio output device (e.g., a speaker or headphones). In some aspects, media output component 515 may be configured to present an interactive user interface (e.g., a web browser or client application) to user 501.

In some aspects, computing device 502 may include an input device 520 for receiving input from user 501. Input device 520 may include, for example, a keyboard, a pointing device, a mouse, a stylus, a touch-sensitive panel (e.g., a touchpad or a touch screen), a camera, a gyroscope, an accelerometer, a position detector, and/or an audio input device. A single component such as a touch screen may function as both an output device of media output component 515 and input device 520.

Computing device 502 may also include a communication interface 525, which may be communicatively coupleable to a remote device. Communication interface 525 may include, for example, a wired or wireless network adapter or a wireless data transceiver for use with a mobile phone network (e.g., Global System for Mobile communications (GSM), 3G, 4G or Bluetooth) or other mobile data network (e.g., Worldwide Interoperability for Microwave Access (WIMAX)).

Stored in memory area 510 are, for example, computer-readable instructions for providing a user interface to user 501 via media output component 515 and, optionally, receiving and processing input from input device 520. A user interface may include, among other possibilities, a web browser and client application. Web browsers enable users 501 to display and interact with media and other information typically embedded on a web page or a website from a web server. A client application allows users 501 to interact with a server application associated with, for example, a vendor or business.

Figure 4:
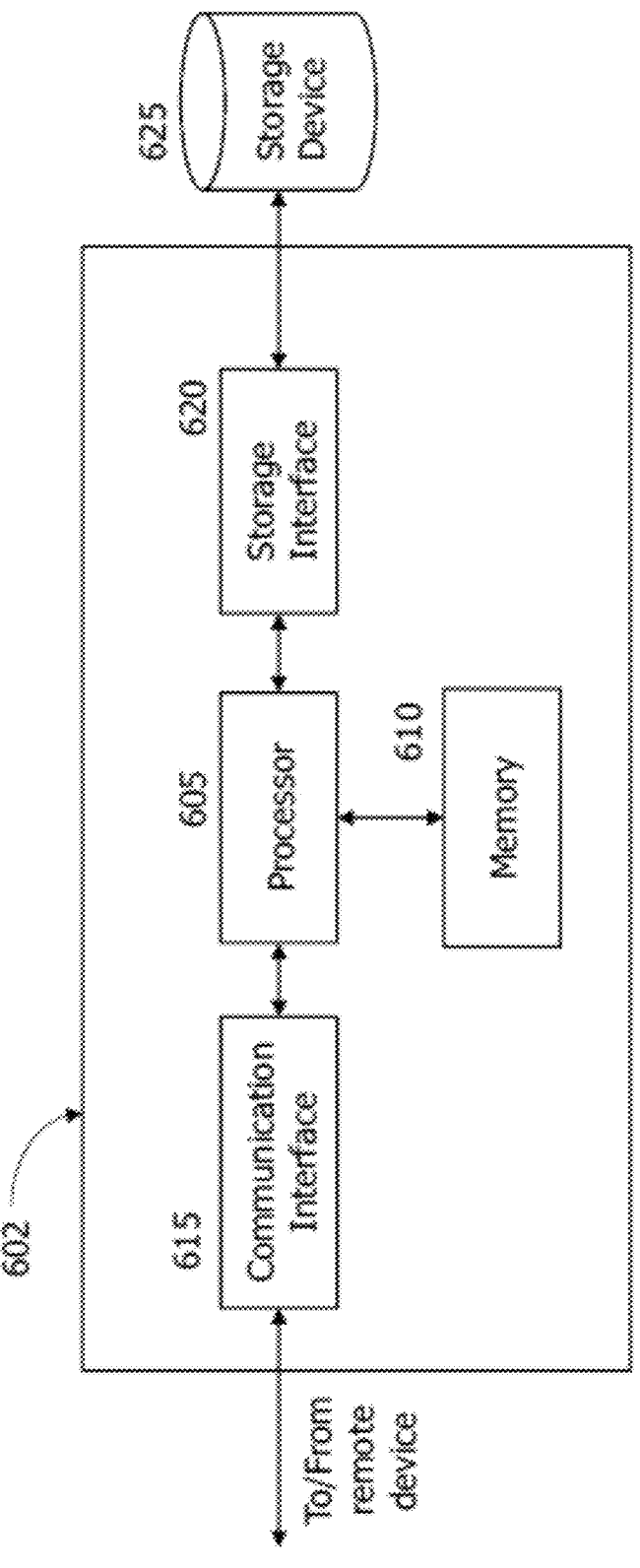
FIG. 4 is a block diagram schematically illustrating a server system in accordance with one aspect of the disclosure.

FIG. 4 illustrates an example configuration of a server system 602. Server system 602 may include, but is not limited to, database server 306 and computing device 302 (both shown in FIG. 1). In some aspects, server system 602 is similar to server system 304 (shown in FIG. 1). Server system 602 may include a processor 605 for executing instructions. Instructions may be stored in a memory area 625, for example. Processor 605 may include one or more processing units (e.g., in a multi-core configuration).

Processor 605 may be operatively coupled to a communication interface 615 such that server system 602 may be capable of communicating with a remote device such as user computing device 330 (shown in FIG. 1) or another server system 602. For example, communication interface 615 may receive requests from user computing device 330 via a network 350 (shown in FIG. 1).

Processor 605 may also be operatively coupled to a storage device 625. Storage device 625 may be any computer-operated hardware suitable for storing and/or retrieving data. In some aspects, storage device 625 may be integrated in server system 602. For example, server system 602 may include one or more hard disk drives as storage device 625. In other aspects, storage device 625 may be external to server system 602 and may be accessed by a plurality of server systems 602. For example, storage device 625 may include multiple storage units such as hard disks or solid-state disks in a redundant array of inexpensive disks (RAID) configuration. Storage device 625 may include a storage area network (SAN) and/or a network-attached storage (NAS) system.

In some aspects, processor 605 may be operatively coupled to storage device 625 via a storage interface 620. Storage interface 620 may be any component capable of providing processor 605 with access to storage device 625. Storage interface 620 may include, for example, an Advanced Technology Attachment (ATA) adapter, a Serial ATA (SATA) adapter, a Small Computer System Interface (SCSI) adapter, a RAID controller, a SAN adapter, a network adapter, and/or any component providing processor 605 with access to storage device 625.

Memory areas 510 (shown in FIG. 3) and 610 may include, but are not limited to, random access memory (RAM) such as dynamic RAM (DRAM) or static RAM (SRAM), read-only memory (ROM), erasable programmable read-only memory (EPROM), electrically erasable programmable read-only memory (EEPROM), and non-volatile RAM (NVRAM). The above memory types are examples only, and are thus not limiting as to the types of memory usable for storage of a computer program.

The computer systems and computer-aided methods discussed herein may include additional, less, or alternate actions and/or functionalities, including those discussed elsewhere herein. The computer systems may include or be implemented via computer-executable instructions stored on non-transitory computer-readable media. The methods may be implemented via one or more local or remote processors, transceivers, servers, and/or sensors (such as processors, transceivers, servers, and/or sensors mounted on vehicle or mobile devices, or associated with smart infrastructure or remote servers), and/or via computer executable instructions stored on non-transitory computer-readable media or medium.

In some aspects, a computing device is configured to implement machine learning, such that the computing device "learns" to analyze, organize, and/or process data without being explicitly programmed. Machine learning may be implemented through machine learning (ML) methods and algorithms. In one aspect, a machine learning (ML) module is configured to implement ML methods and algorithms. In some aspects, ML methods and algorithms are applied to data inputs and generate machine learning (ML) outputs. Data inputs may include but are not limited to images or frames of a video, object characteristics, and object categorizations. Data inputs may further include sensor data, image data, video data, telematics data, authentication data, authorization data, security data, mobile device data, geolocation information, transaction data, personal identification data, financial data, usage data, weather pattern data, "big data" sets, and/or user preference data. ML outputs may include but are not limited to: a tracked shape output, categorization of an object, categorization of a region within a medical image (segmentation), categorization of a type of motion, a diagnosis based on motion of an object, motion analysis of an object, and trained model parameters ML outputs may further include: speech recognition, image or video recognition, medical diagnoses, statistical or financial models, autonomous vehicle decision-making models, robotics behavior modeling, fraud detection analysis, user recommendations and personalization, game AI, skill acquisition, targeted marketing, big data visualization, weather forecasting, and/or information extracted about a computer device, a user, a home, a vehicle, or a party of a transaction. In some aspects, data inputs may include certain ML outputs.

In some aspects, at least one of a plurality of ML methods and algorithms may be applied, which may include but are not limited to: genetic algorithms, linear or logistic regressions, instance-based algorithms, regularization algorithms, decision trees, Bayesian networks, cluster analysis, association rule learning, artificial neural networks, deep learning, dimensionality reduction, and support vector machines. In various aspects, the implemented ML methods and algorithms are directed toward at least one of a plurality of categorizations of machine learning, such as supervised learning, unsupervised learning, adversarial learning, and reinforcement learning.

The methods and algorithms of the invention may be enclosed in a controller or processor. Furthermore, methods and algorithms of the present invention, can be embodied as a computer-implemented method or methods for performing such computer-implemented method or methods, and can also be embodied in the form of a tangible or non-transitory computer-readable storage medium containing a computer program or other machine-readable instructions (herein "computer program"), wherein when the computer program is loaded into a computer or other processor (herein "computer") and/or is executed by the computer, the computer becomes an apparatus for practicing the method or methods. Storage media for containing such computer program include, for example, floppy disks and diskettes, compact disk (CD)-ROMs (whether or not writeable), DVD digital disks, RAM and ROM memories, computer hard drives and backup drives, external hard drives, "thumb" drives, and any other storage medium readable by a computer. The method or methods can also be embodied in the form of a computer program, for example, whether stored in a storage medium or transmitted over a transmission medium such as electrical conductors, fiber optics or other light conductors, or by electromagnetic radiation, wherein when the computer program is loaded into a computer and/or is executed by the computer, the computer becomes an apparatus for practicing the method or methods. The method or methods may be implemented on a general-purpose microprocessor or on a digital processor specifically configured to practice the process or processes. When a general-purpose microprocessor is employed, the computer program code configures the circuitry of the microprocessor to create specific logic circuit arrangements. Storage medium readable by a computer includes medium being readable by a computer per se or by another machine that reads the computer instructions for providing those instructions to a computer for controlling its operation. Such machines may include, for example, machines for reading the storage media mentioned above.

Definitions and methods described herein are provided to better define the present disclosure and to guide those of ordinary skill in the art in the practice of the present disclosure. Unless otherwise noted, terms are to be understood according to conventional usage by those of ordinary skill in the relevant art.

In some embodiments, numbers expressing quantities of ingredients, properties such as molecular weight, reaction conditions, and so forth, used to describe and claim certain embodiments of the present disclosure are to be understood as being modified in some instances by the term "about." In some embodiments, the term "about" is used to indicate that a value includes the standard deviation of the mean for the device or method being employed to determine the value. In some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the present disclosure are approximations, the numerical values set forth in the specific examples are reported as precisely as practicable. The numerical values presented in some embodiments of the present disclosure may contain certain errors necessarily resulting from the standard deviation found in their respective testing measurements. The recitation of ranges of values herein is merely intended to serve as a shorthand method of referring individually to each separate value falling within the range. Unless otherwise indicated herein, each individual value is incorporated into the specification as if it were individually recited herein. The recitation of discrete values is understood to include ranges between each value.

In some embodiments, the terms "a" and "an" and "the" and similar references used in the context of describing a particular embodiment (especially in the context of certain of the following claims) can be construed to cover both the singular and the plural, unless specifically noted otherwise. In some embodiments, the term "or" as used herein, including the claims, is used to mean "and/or" unless explicitly indicated to refer to alternatives only or the alternatives are mutually exclusive.

The terms "comprise," "have" and "include" are open-ended linking verbs. Any forms or tenses of one or more of these verbs, such as "comprises," "comprising," "has," "having," "includes" and "including," are also open-ended. For example, any method that "comprises," "has" or "includes" one or more steps is not limited to possessing only those one or more steps and can also cover other unlisted steps. Similarly, any composition or device that "comprises," "has" or "includes" one or more features is not limited to possessing only those one or more features and can cover other unlisted features.

All methods described herein can be performed in any suitable order unless otherwise indicated herein or otherwise clearly contradicted by context. The use of any and all examples, or exemplary language (e.g., "such as") provided with respect to certain embodiments herein is intended merely to better illuminate the present disclosure and does not pose a limitation on the scope of the present disclosure otherwise claimed. No language in the specification should be construed as indicating any non-claimed element essential to the practice of the present disclosure.

Groupings of alternative elements or embodiments of the present disclosure disclosed herein are not to be construed as limitations. Each group member can be referred to and claimed individually or in any combination with other members of the group or other elements found herein. One or more members of a group can be included in, or deleted from, a group for reasons of convenience or patentability. When any such inclusion or deletion occurs, the specification is herein deemed to contain the group as modified thus fulfilling the written description of all Markush groups used in the appended claims.

All publications, patents, patent applications, and other references cited in this application are incorporated herein by reference in their entirety for all purposes to the same extent as if each individual publication, patent, patent application, or other reference was specifically and individually indicated to be incorporated by reference in its entirety for all purposes. Citation of a reference herein shall not be construed as an admission that such is prior art to the present disclosure.

Having described the present disclosure in detail, it will be apparent that modifications, variations, and equivalent embodiments are possible without departing from the scope of the present disclosure defined in the appended claims. Furthermore, it should be appreciated that all examples in the present disclosure are provided as non-limiting examples.

EXAMPLES

The following non-limiting examples are provided to further illustrate the present disclosure. It should be appreciated by those of skill in the art that the techniques disclosed in the examples that follow represent approaches the inventors have found function well in the practice of the present disclosure, and thus can be considered to constitute examples of modes for its practice. However, those of skill in the art should, in light of the present disclosure, appreciate that many changes can be made in the specific embodiments that are disclosed and still obtain a like or similar result without departing from the spirit and scope of the present disclosure.

Example 1—Numerical Validation of Self-Supervised Joint Image Reconstruction and Coil Sensitivity Calibration Method To validate the self-supervised joint image reconstruction and coil sensitivity calibration methods described herein, the following experiments were conducted.

T1-weighted MR brain acquisitions of 60 subjects obtained from the open dataset OASIS-3 were used as the raw ground truth for simulating measurements. These 60 subjects were split into 48, 6, and 6 for training, validation, and testing, respectively. For each subject, the middle 20 to 50 slices (depending on the shape of the brain) were extracted out of the 256 slices on the transverse plane, which contained the most relevant regions of the brain. Those 2D slices corresponded to the set of $\{x_i\}$ from Eqn. (5), described above. CSMs were synthesized using the SigPy. The predefined parameters of this function were the relative radius r=1.5 and the number of coils nzz=8. In order to obtain undersampled measurements, a Cartesian sampling operator of the k-space data was simulated. The sampling rate of the sampling operator was set to 12.5%, 16.67%, and 25% of the full sampling rate for the complete k-space data (corresponding to 8×, 6×, and 4× acceleration, respectively) and added measurement noise corresponding to input signal-to-noise ratios (SNRs) of 30 dB and 40 dB.

Implementation

The DNN architectures for $P_\varphi$ and $\{R_\theta^k\}$ were customized from U-net. After initial experimentation experimented with different values of the regularization parameter $\lambda$ in Eqn. (8) and the unfolded step K, subsequent experiments were performed with $\lambda$ set to 0.002 and K set to 5. Adam was used as the optimizer with a learning rate of 0.001 for the initial 20 epochs and a learning rate of 0.0001 for the remaining epochs. All experiments were performed on a computing device equipped with an Intel Xeon Gold 6130 Processor and an NVIDIA GeForce RTX 2080 Ti GPU.

Evaluation

Two widely used quantitative metrics, peak signal-to-noise ratio (PSNR), measured in decibels (dB), and structural similarity index (SSIM) were evaluated relative to the ground-truth images used to synthesize the measurements.

Comparison Methods

For comparison, image reconstruction was performed using several existing methods: Zero-Filled method, TV (with ESPIRiT) method, U-RED (with JSENSE), and U-RED (with ESPIRiT). The two U-RED methods were similar to the disclosed method, except that the disclosed method jointly produces CSMs, whereas the comparison methods pre-calibrate CSMs using existing algorithms (JSENSE and ESPIRiT).

For the Zero-Filled method, the raw multi-coil and under-sampled measurements were directly back-projected to the image domain by applying a zero-filled inverse Fourier transform followed by the root-sum-of-squares operation.

For the TV (with ESPIRiT) method, a two-step model-based optimization was performed in which the CSMs were pre-calibrated using ESPIRiT and the total variation (TV) reconstruction method as described herein at Eqn. (3) was applied. The regularization parameter $\tau$ was optimized via the grid search.

For the U-RED (with JSENSE), CSMs were pre-calibrated using JSENSE and integrated into the U-RED algorithm described herein.

For the U-RED (with ESPIRiT) CSMs were pre-calibrated using ESPIRiT and integrated into the U-RED algorithm described herein. This baseline method is conceptually similar to the disclosed method, except for differences in the unfolding architectures.

Results

Figure 7A:
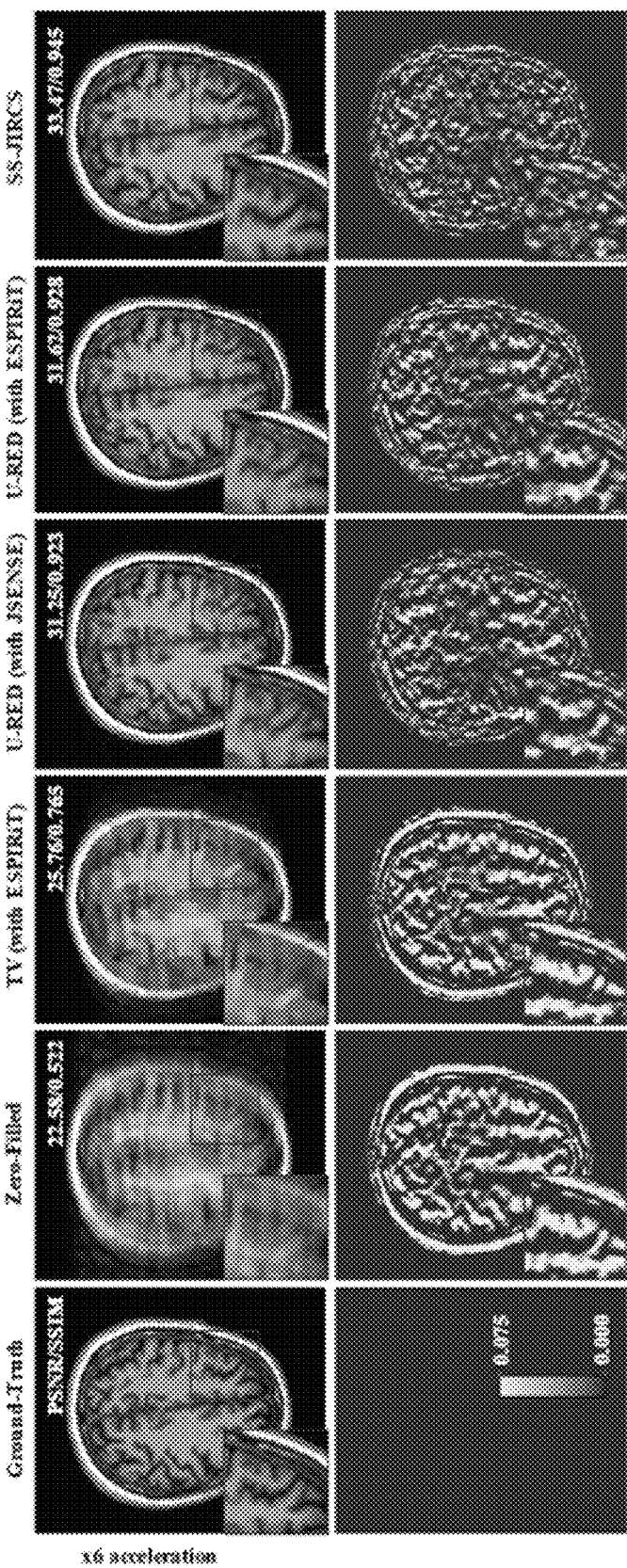
FIG. 7A contains a series of images reconstructed from undersampled measurements at a first subsampling rate with an input SNR of 40 dB. TV (with ESPIRiT) refers to a TV-regularized optimization method that uses CSMs pre-calibrated via ESPIRiT. While both U-RED (with JSENSE) and U-RED (with ESPIRiT) achieve better performance than TV (with ESPIRiT), the proposed method achieves the best performance compared to the baseline methods by jointly performing image reconstruction and CSM calibration in an end-to-end fashion.
Figure 7B:
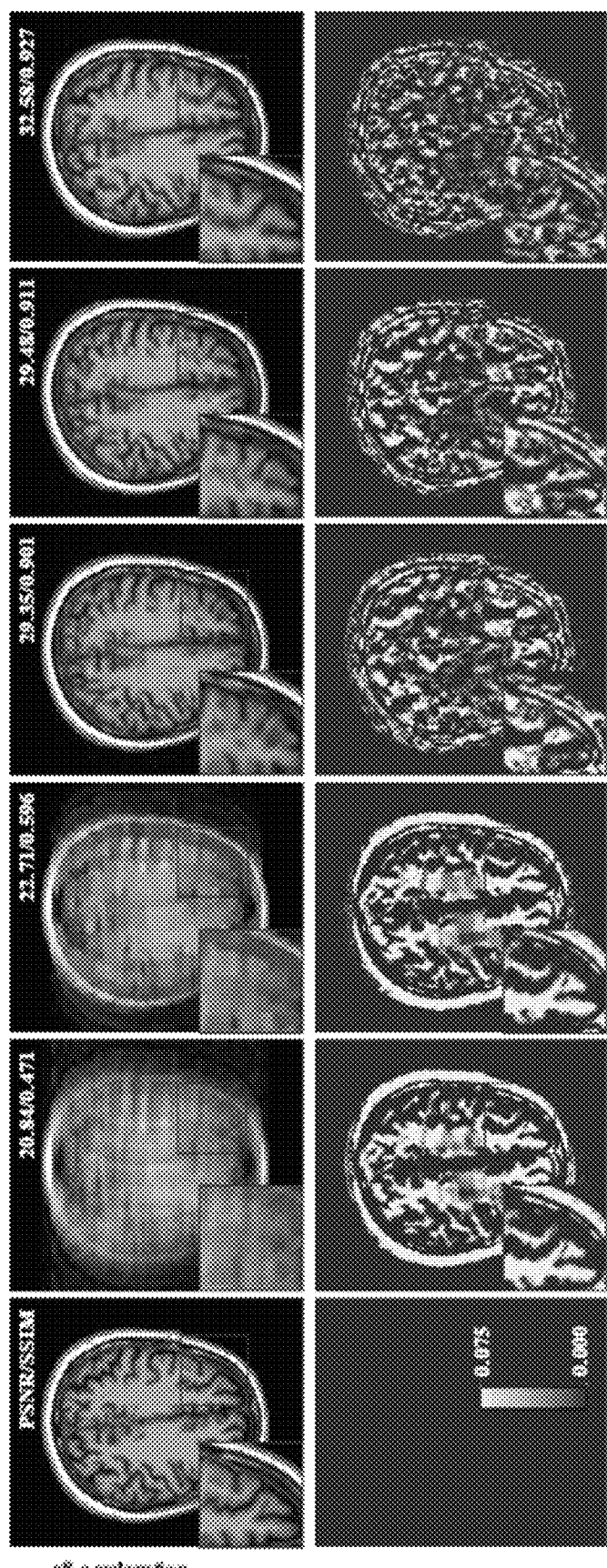
FIG. 7B contains a series of images reconstructed from undersampled measurements at a second subsampling rate with an input SNR of 40 dB annotated similarly to the images of FIG. 7A.

FIGS. 7A and 7B illustrate the results of image reconstruction for undersampling rates by 16.67% (top) and 12.5% (bottom) at a measurement noise level corresponding to an SNR of 40 dB. Zero-Filled images contain blurring and ghosting artifacts, since the raw measurements were directly mapped to the image domain without imposing any regularization. TV (with ESPIRiT) provided better results, but also lead to the loss of detail due to "staircasing" artifacts. The two deep unfolding methods making use of the precalibrated CSMs, U-RED (with ESPIRiT) and U-RED (with JSENSE), provided significantly better performance but still suffered from some blurring. Overall, the disclosed method achieved the best performance compared to all of the baseline methods. The improvement of the proposed method over U-RED (with ESPIRiT), where the only difference was due to the different methods of calibrating the CSMs, demonstrated the benefit of the proposed joint reconstruction and CSMs calibration.

Quantitative results (PSNR and SSIM) evaluated using the testing set described above are summarized in Table 1. The results showed that the performance gains due to the proposed method were maintained across different undersampling rates and noise levels.

TABLE 1

| Average quantitative results. | | | | | |
|---|---|---|---|---|---|
| Sampling Rate (%) | | | | | |
| 25 | | 16.67 | | 12.5 | |
| Measurement SNR | | | | | |
| 30 | 40 | 30 | 40 | 30 | 40 |
| PSNR (dB) | | | | | |
| Zero-Filled | 24.17 | 24.38 | 22.37 | 22.56 | 21.65 | 21.68 |
| TV (with ESPIRiT) | 28.68 | 28.95 | 24.90 | 25.14 | 23.01 | 23.21 |
| U-RED (with JSENSE) | 34.17 | 34.45 | 30.39 | 30.99 | 28.89 | 29.10 |
| U-RED (with ESPIRiT) | 34.39 | 34.75 | 30.91 | 31.56 | 29.04 | 29.29 |
| SS-JIRCS | 35.10 | 35.51 | 31.62 | 32.37 | 30.56 | 30.97 |
| SSIM | | | | | |
| Zero-Filled | 0.520 | 0.538 | 0.498 | 0.509 | 0.454 | 0.464 |
| TV (with ESPIRiT) | 0.885 | 0.886 | 0.701 | 0.712 | 0.569 | 0.573 |
| U-RED (with JSENSE) | 0.948 | 0.957 | 0.921 | 0.926 | 0.883 | 0.891 |

TABLE 1-continued

| Average quantitative results. | | | | | |
|---|---|---|---|---|---|
| Sampling Rate (%) | | | | | |
| 25 | | 16.67 | | 12.5 | |
| Measurement SNR | | | | | |
| 30 | 40 | 30 | 40 | 30 | 40 |
| U-RED (with ESPIRiT) | 0.961 | 0.962 | 0.922 | 0.931 | 0.875 | 0.896 |
| SS-JIRCS | 0.966 | 0.966 | 0.930 | 0.939 | 0.918 | 0.922 |

Figure 8:
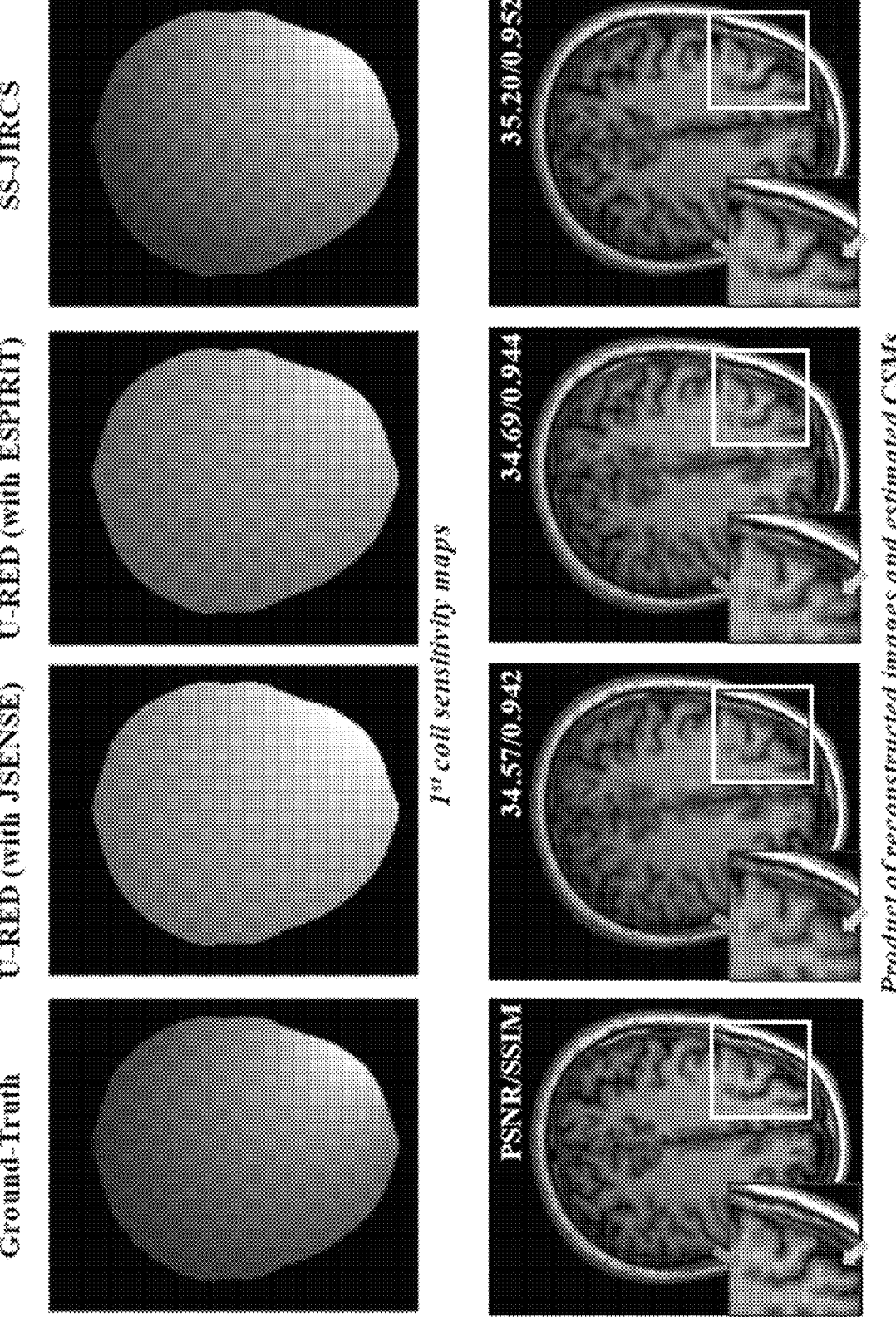
FIG. 8 contains a series of images comparing the 1st CSM estimated at a sampling rate of 16.67% and at a level of measurement noise corresponding to 30 dB SNR. The images of the top row show the estimated CSMs, and the images of the bottom row show the product of the CSM with the image reconstructed by the corresponding method. Visual differences in the regions of interest are highlighted using yellow and orange arrows. The proposed method obtains better CSMs in terms of visual consistency and image quality as compared to existing methods.

FIG. 8 illustrates the CSMs obtained by different methods at the undersampling rate of 16.67% and at a measurement noise level corresponding to 30 dB SNR. Visual differences in the regions of interest were highlighted using yellow and orange arrows. In order to evaluate the quality of the estimated CSMs, the products of the 1st CSMs (i.e., CSMs from the first channel) obtained using different methods with the corresponding reconstructed images were computed. The resulting single-coil images were then quantitatively evaluated using PSNR and SSIM values relative to the ground-truth images multiplied by the 1st ground-truth CSMs. The quantitative metrics of $S_1\hat{x}$ with respect to $S_1x$ were compared, in which $S_1$ represented the 1st synthetic CSMs, x represented a slice of the ground-truth volume, $\hat{S}_1$ represented the corresponding estimated CSM, and $\hat{x}$ represented the corresponding reconstructed image. The results shown summarized in FIG. 8 demonstrated that the disclosed method better estimated CSMs relative to several existing methods in terms of visual consistency and image quality.

Table 2 presents the results of an ablation study showing the influence of different steps of the disclosed CSM estimation on the pipeline and the effectiveness of $Loss_{Smooth}$ in the loss function of Eqn. (8) above. In Step (a) of the disclosed CSM estimation module, the Hamming-windowed low-frequency region of the k-space was extracted. Other data extraction schemes in k-space were evaluated as summarized in Table 2. The vector $\hat{y}ACS$ denoted the auto-calibration signal (ACS) region of the k-space and $\hat{y}Low$-k denoted the low-frequency region of the k-space before the application of the Hamming windows. ACS referred to a fully sampled region at the center of k-space collected along with the undersampled data, which contained both low- and high-frequency information. In Table 2, various combinations of the extracted k-space data and the inclusion or exclusion of $Loss_{Smooth}$ were compared. The $\hat{y}ACS$ entries corresponded to an experimental setup where the ACS region of the k-space was extracted and $Loss_{Smooth}$ was excluded from the loss function. The $\hat{y}Low$-k entries were similar to the $\hat{y}ACS$ entries except that the low-frequency region of the k-space was extracted.

TABLE 2

| Quantitative results summarizing the influence of different steps of the disclosed CSM estimation pipeline. | | | | | |
|---|---|---|---|---|---|
| Sampling Rate (%) | | | | | |
| 25 | | 16.67 | | 12.5 | |
| Measurement SNR | | | | | |
| 30 | 40 | 30 | 40 | 30 | 40 |
| PSNR (dB) | | | | | |
| $\hat{y}ACS$ | 34.81 | 35.15 | 31.28 | 31.59 | 30.08 | 30.41 |
| $\hat{y}Low$ − k | 34.59 | 34.88 | 30.99 | 31.27 | 29.79 | 30.01 |
| $\hat{y}Low$ − k + | 34.38 | 34.73 | 30.89 | 31.55 | 28.88 | 29.01 |

TABLE 2-continued

| Quantitative results summarizing the influence of different steps of the disclosed CSM estimation pipeline. | | | | | |
| --- | --- | --- | --- | --- | --- |
| Sampling Rate (%) | | | | | |
| 25 | | 16.67 | | 12.5 | |
| Measurement SNR | | | | | |
| 30 | 40 | 30 | 40 | 30 | 40 |
| $LOSS_{Smooth}$ | | | | | |
| Ham(yLow − k) | 34.90 | 35.27 | 31.35 | 31.71 | 30.27 | 30.66 |
| SS-JIRCS: | 35.10 | 35.51 | 31.62 | 32.37 | 30.56 | 30.97 |
| Ham(yLow − k) + $LOSS_{Smooth}$ | | | | | |
| SSIM | | | | | |
| $\hat{y}$ACS | 0.965 | 0.965 | 0.929 | 0.935 | 0.910 | 0.911 |
| $\hat{y}$Low − k | 0.964 | 0.964 | 0.928 | 0.929 | 0.907 | 0.910 |
| $\hat{y}$Low − k + $LOSS_{Smooth}$ | 0.961 | 0.961 | 0.927 | 0.928 | 0.877 | 0.894 |
| Ham(yLow − k) | 0.937 | 0.940 | 0.930 | 0.939 | 0.907 | 0.915 |
| SS-JIRCS: Ham(yLow − k) + $LOSS_{Smooth}$ | 0.966 | 0.966 | 0.930 | 0.939 | 0.918 | 0.922 |

The results summarized in Table 2 demonstrated the benefit of using both the Hamming windowed low-frequency region of the k-space and the smoothness regularization in the disclosed method.

What is claimed is:

1. A computer-aided method of image reconstruction for parallel magnetic resonance (MR) imaging, the method comprising:

a. receiving, using a computing device, a k-space single-coil measurement dataset comprising at least two k-space measurement sets, each k-space measurement set obtained by a single coil of a parallel MR imaging device;

b. transforming, using the computing device, the k-space single-coil measurement dataset to an estimated coil sensitivity map (CSM) using a CSM deep neural network, the transforming comprising:

i. extracting, using the computing device, a small central k-space region from each k-space measurement set;

ii. transforming, using the computing device, each small central k-space region into a single-coil MR image comprising a plurality of complex elements;

iii. separating, using the computing device, a real value and an imaginary value from each complex element of each single-coil MR image and concatenating, using the computing device, the real and imaginary values of all single-coil MR images into a single-coil MR image dataset;

iv. transforming, using the computing device, the single-coil MR image dataset into the estimated CSM using the CSM deep neural network; and v. calculating, using the computing device, the estimated CSM Ŝ according to the equation:

$$\hat{S} = P_\varphi(p^0);$$

wherein $P_\varphi$ represents the CSM with predetermined parameters $\varphi$ and $p^0$ represents a zero-filled inverse Fourier transform of the small central k-space regions from each k-space measurement set; and c. transforming, using the computing device, the k-space single-coil measurement dataset and the estimated CSM into a final MR image using an MRI reconstruction module comprising an unfolded regularization by denoising (U-RED) module, the U-RED module comprising a data consistency module and a regularization module, the regularization module comprising a U-RED deep neural network (DNN), wherein:

i. transforming, using the computing device, each k-space measurement set into an intermediate single-coil MR image using a Fourier transform;

ii. performing, using the computing device, an unfolded regularization by denoising comprising K iterations, each iteration comprising:

1. refining the intermediate single-coil MR images using the regularization module by transforming, using the computing device, the intermediate single-coil MR images into an intermediate MR image using the estimated CSM; and transforming, using the computing device, the intermediate MR image into a regularization correction using the U-RED DNN; and 2. enforcing consistency of intermediate single-coil k-space data predicted from the intermediate single-coil MR images with the k-space single-coil measurement dataset by transforming, using the computing device, the intermediate single-coil MR images into intermediate single-coil k-space data using a Fourier transform, transforming, using the computing device, the intermediate single-coil k-space data into predicted intermediate single-coil k-space measurements using an undersampling operator, and calculating, using the computing device, a difference between the predicted intermediate single-coil k-space measurements and the k-space single-coil measurement dataset to produce a data consistency correction; and 3. transforming, using the computing device, the intermediate single-coil MR images as refined after U-RED into the final MR image.

2. The method of claim 1, wherein the CSM deep neural network comprises a CSM convolutional neural network.

3. The method of claim 1, wherein extracting the small central k-space regions comprises applying, using the computing device, a Hamming window to each k-space measurement set.

4. The method of claim 1, wherein transforming each small central k-space region into each corresponding single-coil MR image comprises applying, using the computing device, a zero-filled inverse Fourier transform to each small central k-space region.

5. The method of claim 1, wherein each iteration of performing unfolded regularization by denoising further comprises updating, using the computing device, the intermediate single-coil MR images based on the regularization correction and the data consistency correction.

6. The method of claim 5, wherein updating the intermediate single-coil MR images based on the regularization correction and the data consistency correction comprises calculating, using the computing device, the updated intermediate single-coil MR images $\hat{c}^{k+1}$ according to the equation:

$$\hat{c}^{k+1} = \hat{c}^k - \gamma^k\left(\nabla g(\hat{c}^k, y)\right) + \tau^k \hat{S} R_\theta^k\left(\hat{S}^\dagger \hat{c}^k\right)),$$

wherein $\nabla g(\hat{c}^k, y) = F^\dagger(\hat{P}F\hat{c}^k - y)$, $\hat{c}^k$ represents the intermediate multi-coil images in the kth iteration of K iterations, $\gamma^k(\nabla g(\hat{c}^k, y)$ represents the data consistency correction, $$\tau^k \hat{S} R_\theta^k\left(\hat{S}^\dagger \hat{c}^k\right))$$

represents the regularization correction, $\gamma^k$ represents predetermined consistency parameters, $\tau^k$ represents pre-determined regularization parameters, $\hat{S}$ represents the estimated CSM, $$R_\theta^k$$

represents the U-RED DNN with pre-determined parameters $\theta$, $\hat{S}^\dagger$ represents the inverse of the estimated CSM, $F^\dagger$ represents the inverse Fourier transform, $\hat{P}$ represents the k-space sampling operator, and y represents the k-space single-coil measurement dataset.

7. The method of claim 6, further comprising training, using the computing device, the CSM DNN and the U-RED DNN using a stochastic gradient method to jointly optimize parameters $\varphi$ of the CSM DNN $P_\varphi$ and parameters $\theta$ of the U-RED DNN $R_\theta$ using a training set comprising N multi-coil undersampled k-space measurement pairs $$\{\hat{y}_i, \tilde{y}_i\}_1^N, \hat{y}_i$$

denoting training measurements, $\tilde{y}_i$ comprising raw measurements, wherein the measurements in each pair are acquired from the same object.

8. The method of claim 7, wherein the multi-coil undersampled measurement pairs $$\{\hat{y}_i, \tilde{y}_i\}_1^N$$

are acquired from at least one of: at least two measurement sets of the same object obtained in at least two different parallel MR scans and two subsets of a measurement set obtained in a single parallel MR scan.

9. The method of claim 7, wherein the training set does not comprise a ground truth dataset.

10. The method of claim 7, wherein training the CSM DNN and the U-RED DNN using a stochastic gradient method further comprises minimizing, using the computing device, a weighted sum loss function given by:

$$\text{Loss} = Loss_{rec} + \lambda \cdot Loss_{smooth}, \text{ wherein}$$

$$Loss_{rec} = \frac{1}{N}\sum_i^N \mathcal{L}_{rec}\left(\hat{H}^i\hat{x}^i, \bar{y}^i\right) + \mathcal{L}_{rec}\left(\hat{H}^i\tilde{x}^i, \tilde{y}^i\right) \text{ and}$$

$$Loss_{smooth} = \frac{1}{N}\sum_i^N \left\|D\hat{S}^i\right\|_2^2 + \left\|D\tilde{S}^i\right\|_2^2;$$

wherein $\lambda$ is a regularization parameter, $L_{rec}$ denotes the $l_2$-norm, and D denotes the discrete gradient.

11. A system for image reconstruction for parallel magnetic resonance (MR) imaging, the system comprising a computing device comprising at least one processor, the at least one processor configured to:

a. receive a k-space single-coil measurement dataset comprising at least two k-space measurement sets, each k-space measurement set obtained by a single coil of a parallel MR imaging device;

b. transform the k-space single-coil measurement dataset to an estimated coil sensitivity map (CSM) using a CSM deep neural network comprising a CSM convolutional neural network by:

i. extracting a small central k-space region from each k-space measurement set;

ii. transforming each small central k-space region into a single-coil MR image comprising a plurality of complex elements;

iii. separating a real value and an imaginary value from each complex element of each single-coil MR image and concatenating the real and imaginary values of all single-coil MR images into a single-coil MR image dataset;

iv. transforming the single-coil MR image dataset into the estimated CSM using the CSM deep neural network;

v. calculating the estimated CSM $\hat{S}$ according to the equation:

$$\hat{S} = P_\varphi(p^0);$$

wherein $P_\varphi$ represents the CSM with predetermined parameters $\varphi$ and $p^0$ represents a zero-filled inverse Fourier transform of the small central k-space regions from each k-space measurement set; and c. transform the k-space single-coil measurement dataset and the estimated CSM into a final MR image using an MRI reconstruction module by:

i. transforming each k-space measurement set into an intermediate single-coil MR image using a Fourier transform;

ii. performing an unfolded regularization by denoising comprising K iterations, each iteration comprising:

1. refining the intermediate single-coil MR images using the regularization module by;

a. transforming the intermediate single-coil MR images into an intermediate MR image using the estimated CSM; and b. transforming the intermediate MR image into a regularization correction using the U-RED DNN; and 2. enforcing consistency of intermediate single-coil k-space data predicted from the intermediate single-coil MR images with the k-space single-coil measurement dataset by:

a. transforming the intermediate single-coil MR images into intermediate single-coil k-space data using a Fourier transform;

b. transforming the intermediate single-coil k-space data into predicted intermediate single-coil k-space measurements using an undersampling operator; and c. calculating a difference between the predicted intermediate single-coil k-space measurements and the k-space single-coil measurement dataset to produce a data consistency correction; and iii. transforming the intermediate MR image as refined after U-RED into the final MR image.

12. The system of claim 11, wherein the at least one processor is further configured to enforce consistency of the intermediate single-coil k-space data by:

a. transforming the intermediate single-coil MR images into intermediate single-coil k-space data using a Fourier transform;

b. transforming the intermediate single-coil k-space data into predicted intermediate single-coil k-space measurements using an undersampling operator; and c. calculating a difference between the predicted intermediate single-coil k-space measurements and the k-space single-coil measurement dataset to produce a data consistency correction.

13. The system of claim 12, wherein the at least one processor is further configured to performing unfolded regularization by denoising iteratively by updating the intermediate single-coil MR images based on the regularization correction and the data consistency correction.

14. The system of claim 13, wherein the at least one processor is further configured to update the intermediate single-coil MR images based on the regularization correction and the data consistency correction by calculating, the updated intermediate single-coil MR images $\hat{c}^{k+1}$ according to the equation:

$$\hat{c}^{k+1} = \hat{c}^k - \gamma^k\left(\nabla g(\hat{c}^k, y) + \tau^k \hat{S} R_\theta^k(\hat{S}^\dagger \hat{c}^k)\right),$$

wherein $\nabla g(\hat{c}^k, y) = F^\dagger(\hat{P}F\hat{c}^k - y)$, $\hat{c}^k$ represents the intermediate multi-coil images in the kth iteration of K iterations, $\gamma^k(\nabla g(\hat{c}^k, y)$ represents the data consistency correction, $$\tau^k \hat{S} R_\theta^k(\hat{S}^\dagger \hat{c}^k))$$

represents the regularization correction, $\gamma^k$ represents pre-determined consistency parameters, $\tau^k$ represents pre-determined regularization parameters, $\hat{S}$ represents the estimated CSM, $$R_\theta^k$$

represents the U-RED DNN with pre-determined parameters θ, $\hat{S}^\dagger$ represents the inverse of the estimated CSM, $F^\dagger$ represents the inverse Fourier transform, $\hat{P}$ represents the k-space sampling operator, and y represents the k-space single-coil measurement dataset.

* * * * *